US006429651B1

(12) United States Patent
Choi et al.

(10) Patent No.: US 6,429,651 B1
(45) Date of Patent: Aug. 6, 2002

(54) DIFFERENTIAL SPIRAL MAGNETIC FIELD SENSING DEVICE AND MAGNETIC FIELD DETECTION MODULE USING THE SAME

(75) Inventors: Sang-on Choi; Han-ki Cho, both of Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/361,151

(22) Filed: Jul. 27, 1999

(30) Foreign Application Priority Data

Jul. 28, 1998 (KR) .......................................... 98-30376

(51) Int. Cl.[7] .............................................. G01R 33/02
(52) U.S. Cl. ........................ 324/249; 324/225; 324/260
(58) Field of Search ................................ 29/595, 592.1, 29/602.1; 324/249, 200, 252, 225, 244, 260, 262; 360/110, 123, 125

(56) References Cited

FOREIGN PATENT DOCUMENTS

| GB | 2 201 786 A | 9/1988 |
|----|-------------|--------|
| JP | 8-179023 | 7/1996 |
| JP | 8-179023 A | * 7/1996 |

* cited by examiner

*Primary Examiner*—Jay Patidar
(74) *Attorney, Agent, or Firm*—Burns, Doane, Swecker & Mathis, LLP

(57) ABSTRACT

A differential spiral magnetic field sensing device is constructed such that two soft magnetic film cores are arranged parallel to each other, each soft magnetic film core is divided into several parts in a detection axial direction to reduce anti-magnetic field components, the differential excitation coil, the magnetic flux variation detecting coil and the zero magnetic field detecting coil are laminated and wound turn by turn around the soft magnetic film cores, and there is no induced voltage waveform to the magnetic flux variation detecting coil without external magnetic field. Also, in order to minimize the leaked magnetic field components of the soft magnetic film cores, the soft magnetic film cores are sandwiched to form closed magnetic paths, and the differential excitation coil, the magnetic flux variation detecting coil and the zero magnetic field detecting coil are spirally laminated around the sandwiched soft magnetic film cores. Further, in the magnetic field detection module, a differential spiral magnetic field sensing device and a signal process for driving the same are integrated on the substrate of a monolithic semiconductor device.

9 Claims, 10 Drawing Sheets

H (CORE 1)

Hext+Hexc
Hexc

H (CORE 2)

Hext−Hexc
−Hexc

B (CORE 1)

Bext+Bexc
Bexc

B (CORE 2)

Bext−Bexc
−Bexc

Vind1, Vind2

Vind1+Vind2 ifb

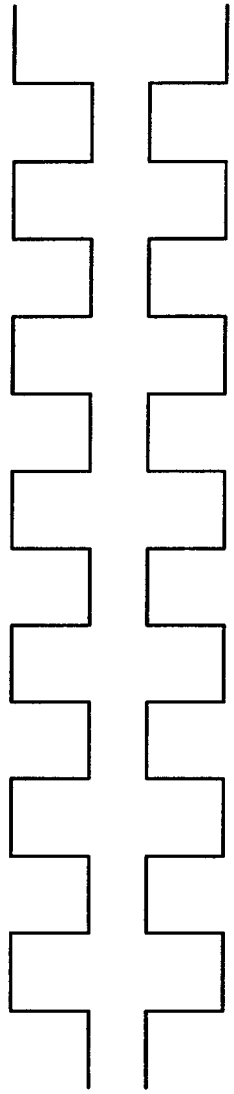
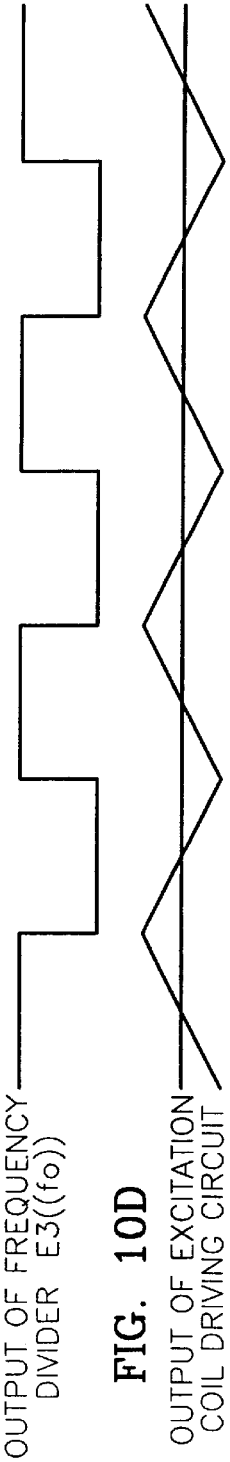
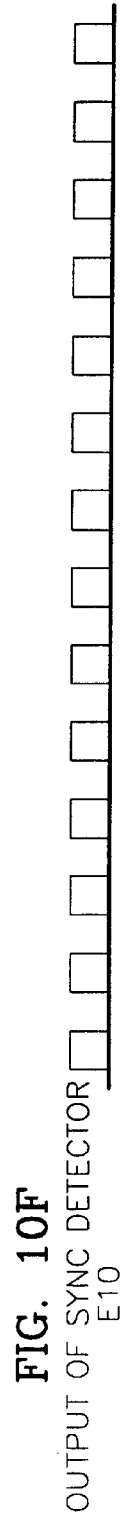
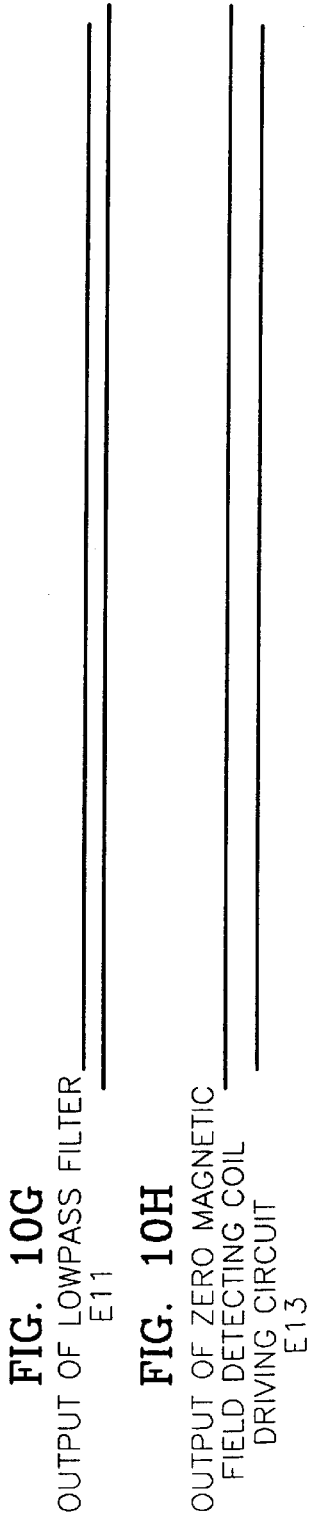
FIG. 10A
$\phi E6\ (2(f_o))$
FIG. 10B
$\bar{\phi}E7\ (2(f_o))$
FIG. 10C
OUTPUT OF FREQUENCY DIVIDER E3($(f_o)$)
FIG. 10D
OUTPUT OF EXCITATION COIL DRIVING CIRCUIT E5
FIG. 10E
OUTPUT OF RF-AMP E9
FIG. 10F
OUTPUT OF SYNC DETECTOR E10
FIG. 10G
OUTPUT OF LOWPASS FILTER E11
FIG. 10H
OUTPUT OF ZERO MAGNETIC FIELD DETECTING COIL DRIVING CIRCUIT E13

DIFFERENTIAL SPIRAL MAGNETIC FIELD SENSING DEVICE AND MAGNETIC FIELD DETECTION MODULE USING THE SAME

This application claims priority under 35 U.S.C. §§119 and/or 365 to Ser. No. 98-30376 filed in Korea on Jul. 28. 1998; the entire content of which is hereby incorporated by reference.

BACKGROUND OF THE INVENTION

1. Field of the Invention

The present invention relates to a differential spiral magnetic field sensing device having microscopic closed magnetic paths integrated on a semiconductor substrate with a signal processor, and a magnetic field detection module, and more particularly, to a differential spiral magnetic field sensing device for detecting a magnetic field weaker than a terrestrial magnetic field using a soft magnetic film core, and a magnetic field detection module which is integrated on a semiconductor substrate with a signal processor by applying a LIGA (Lithography, Galvanoforming, and plastic molding)-like technique and an IC (Integrated Circuit) fabrication technique to the differential spiral magnetic field sensing device.

2. Description of the Related Art

A magnetic sensor using a soft magnetic material and a coil has long been used as a magnetic sensor with high sensitivity. Such a magnetic sensor is manufactured by winding a coil around a relatively large rod-shaped core or an annular core made of soft magnetic ribbon. In order to accurately detect a magnetic field, an electromagnetic circuit is necessary. A method in which a magnetic field sensing element of the magnetic sensor is attained by a soft magnetic film core and a planar film coil has been proposed.

As shown in FIG. 1, a conventional weak magnetic field sensing device is manufactured using soft magnetic film cores $1a$ and $1b$ and a planar film coil. These two cores $1a$ and $1b$ are arranged in parallel in the direction of a detection axis to then be differentially driven. This is for offsetting an induced voltage based on electromagnetic induction when no external magnetic field is applied such that an excitation coil $2a$–$2b$ and a magnetic field detecting coil $3a$–$3b$ are wound around two soft magnetic film cores $1a$ and $1b$. Thus, the conventional weak magnetic field sensing device requires a large area. Also, due to a magnetic flux variation generated by the excitation coil $2a$–$2b$ and a magnetic field detected by the magnetic flux variation detecting coil $3a$–$3b$, leakage of magnetic flux through the soft magnetic film cores $1a$ and $1b$ cannot be avoided, which makes it difficult to detect a magnetic field with high sensitivity.

Since the conventional weak magnetic field sensing device is manufactured by winding a coil around a relatively large rod-shaped core or an annular core made of soft magnetic ribbon, the manufacturing cost thereof is high.

SUMMARY OF THE INVENTION

To solve the above problems, it is an objective of the present invention to provide a differential spiral magnetic field sensing device with a high sensitivity, which can accurately detect an external magnetic field, and can be fabricated on a microscopic scale on a semiconductor substrate, and a magnetic field detection module using the same.

Accordingly, to achieve the above objective, there is provided a differential spiral magnetic field sensing device including a semiconductor substrate, soft magnetic film cores stacked on the semiconductor substrate to be laminated to form closed magnetic paths, an excitation coil formed of a metal thin film for alternate excitation of the soft magnetic film cores, a magnetic flux variation detecting coil made of a metal thin film for detection of magnetic flux variation in the soft magnetic film cores, and a zero magnetic field detecting coil for generating anti-magnetic field components for eliminating magnetic flux variation in the soft magnetic film cores generated by an external magnetic field.

In the present invention, the soft magnetic film cores are preferably divided into two parts to then be arranged parallel to each other, the two-part soft magnetic film cores are sub-divided into a predetermined number of parts, the excitation coil is wound n turns, where n is a positive integer, the magnetic flux variation detecting coil is wound m turns, where m is a positive integer different from n, and the zero magnetic field detecting coil is wound one turn, the excitation coil, the magnetic flux variation detecting coil and the zero magnetic field detecting coil being laminated, and wherein when an external magnetic field is zero, the induced waveforms caused by the excitation coil are offset. Also, two soft magnetic film cores are arranged one on top of the other, and the excitation coil, the magnetic flux variation detecting coil and the zero magnetic field detecting coil are laminated on three planes in the form of spiral bottom-layer, middle-layer and top-layer wires between the soft magnetic film cores.

Also, according to another aspect of the present invention, there is provided a magnetic field detection module including a differential spiral magnetic field sensing device having a semiconductor substrate, soft magnetic film cores stacked on the semiconductor substrate to be laminated to form closed magnetic paths, an excitation coil formed of a metal thin film for alternate excitation of the soft magnetic film cores, a magnetic flux variation detecting coil made of a metal thin film for detection of magnetic flux variation in the soft magnetic film cores, and a zero magnetic field detecting coil for generating anti-magnetic field components for eliminating magnetic flux variation in the soft magnetic film cores generated by an external magnetic field, an excitation coil driving circuit connected to the excitation coil and integrated on the semiconductor substrate, a magnetic field detecting signal processing circuit connected to the magnetic field variation detecting coil and integrated on the semiconductor substrate, and a zero magnetic detecting signal processing circuit connected to the zero magnetic field detecting coil and integrated on the semiconductor substrate.

In the present invention, preferably, the soft magnetic film cores are divided into two parts to then be arranged parallel to each other, the two-part soft magnetic film cores are sub-divided into a predetermined number of parts, the excitation coil is wound n turns, where n is a positive integer, the magnetic flux variation detecting coil is wound m turns, where m is a positive integer, and the zero magnetic field detecting coil is wound one turn, the excitation coil, the magnetic flux variation detecting coil and the zero magnetic field detecting coil being laminated, and wherein when an external magnetic field is zero, the induced waveforms caused by the excitation coil are offset. Also, two soft magnetic film cores are preferably arranged one on top of the other, and the excitation coil, the magnetic flux variation detecting coil and the zero magnetic field detecting coil are laminated on three planes in the form of spiral bottom-layer, middle-layer and top-layer wires in the soft magnetic film cores. Further, it is preferable that the excitation coil driving circuit includes a rectangular wave oscillator for generating rectangular wave voltage pulses, a frequency divider for dividing the rectangular wave voltage pulses to a half and a fourth, respectively, a waveform converter for converting the one fourth rectangular wave voltage pulse into a triangular voltage pulse, and an excitation coil driver for driving the excitation coil using the triangular voltage pulse.

BRIEF DESCRIPTION OF THE DRAWINGS

The above objectives and advantages of the present invention will become more apparent by describing in detail a preferred embodiment thereof with reference to the attached drawings in which:

FIGS. 10A though 10H are timing diagrams for illustrating the operation of the integrated circuit having the magnetic field sensing device shown in FIG. 9.

DESCRIPTION OF THE PREFERRED EMBODIMENT

Figure 1:
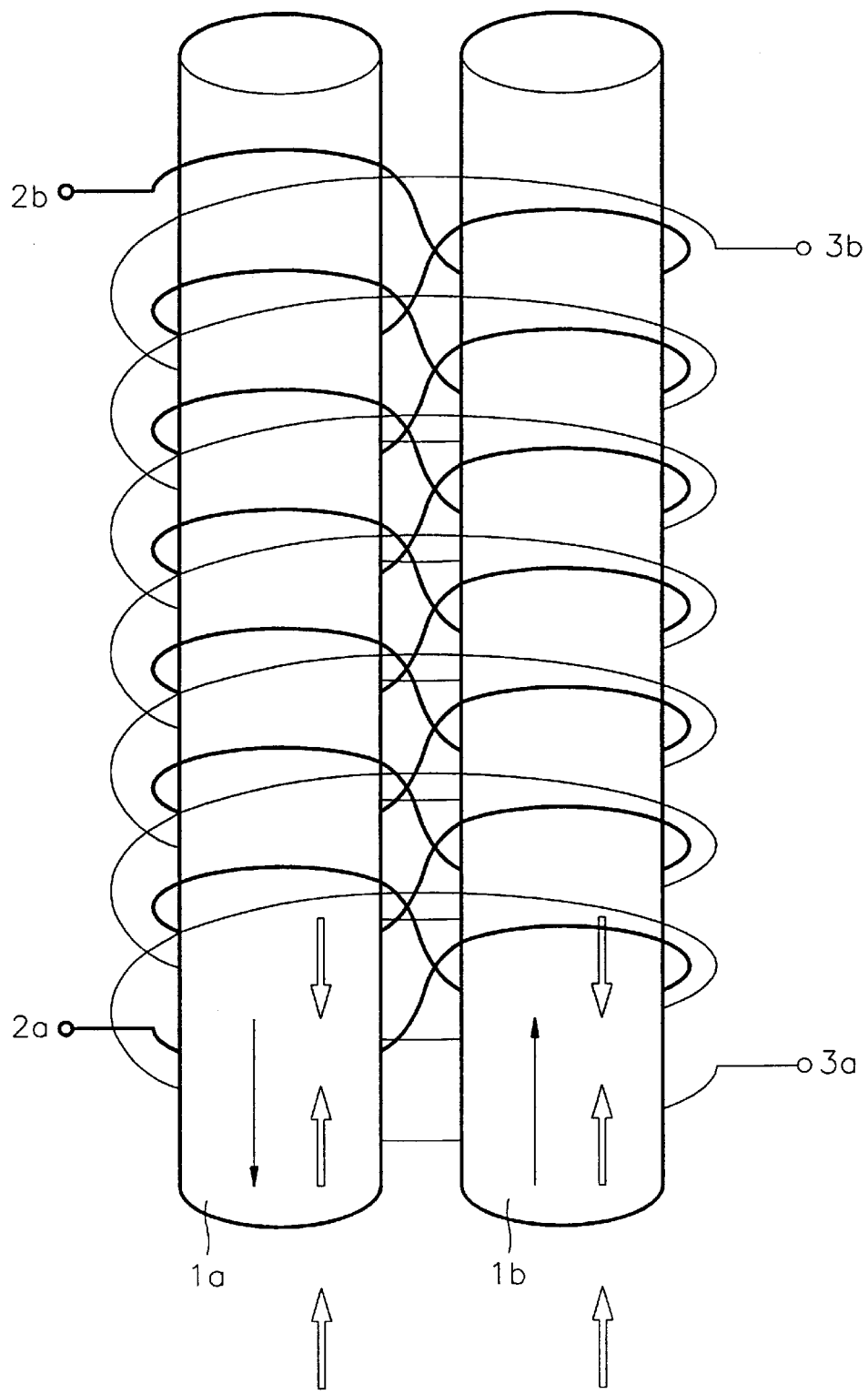
FIG. 1 is a schematic perspective view illustrating a conventional magnetic field sensing device.
Figure 2:
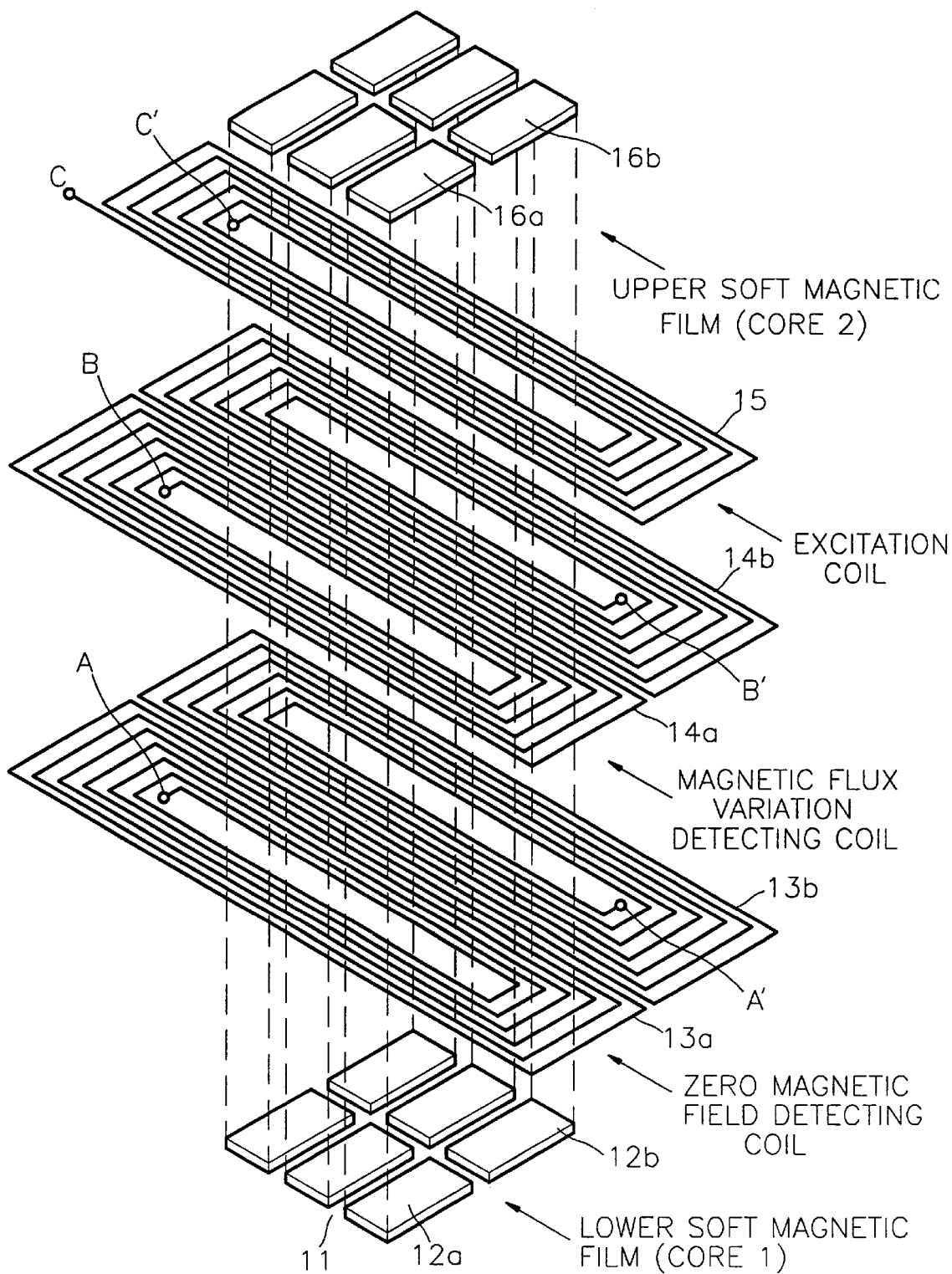
FIG. 2 is a schematic perspective view illustrating a magnetic field sensing device according to an embodiment of the present invention.
Figure 3A:
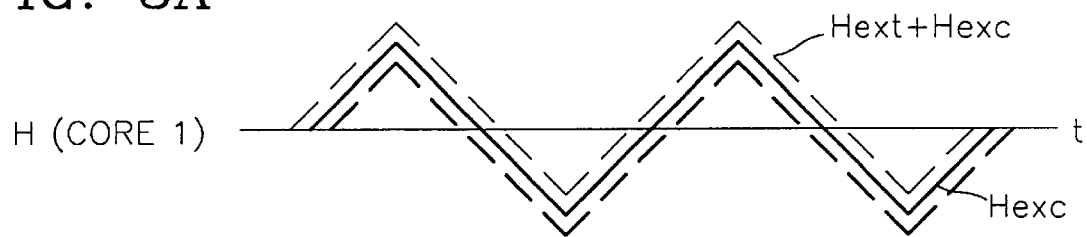
FIGS. 3A through 3G are timing diagrams for illustrating the operation of the magnetic field tensing device shown in FIG. 2.
Figure 3B:
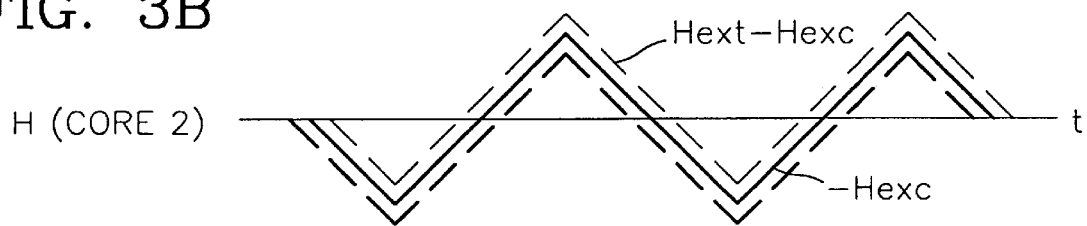
Figure 3C:
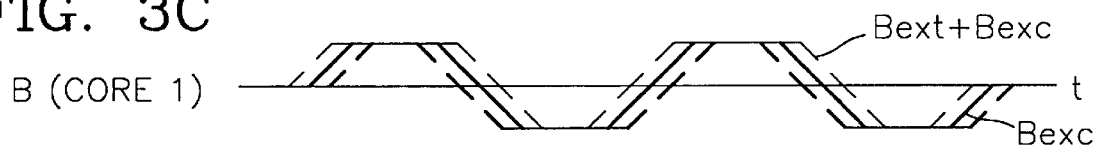
Figure 3D:
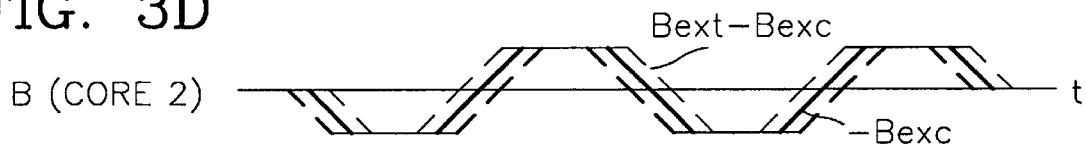
Figure 3E:
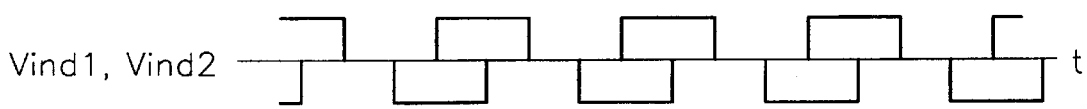
Figure 3F:
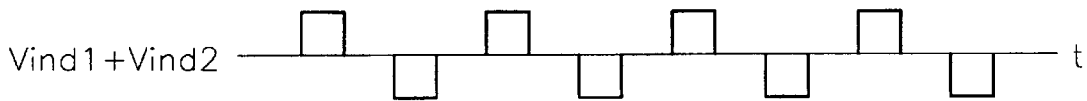
Figure 3G:

FIG. 2 is a schematic perspective view illustrating a magnetic field sensing device according to an embodiment of the present invention, and FIGS. 3A through 3G are timing diagrams for illustrating the operation of the magnetic field sensing device shown in FIG. 2. In detail, FIG. 3A is a waveform diagram of a magnetic field of a first soft magnetic film core, FIG. 3B is a waveform diagram of a magnetic field of a second soft magnetic film core, FIG. 3C is a waveform diagram of the magnetic flux density of the first soft magnetic film core, FIG. 3D is a waveform diagram of a magnetic flux density of the second soft magnetic film core, FIG. 3E shows waveform diagrams of induced voltages Vind1 and Vind2 in first and second magnetic flux variation detecting coils, FIG. 3F shows waveform diagrams of a combined voltage Vind1+Vind2 of the induced voltages in the first and second magnetic flux variation detecting coils, and FIG. 3G shows a waveform diagram of an induced voltage in a zero magnetic field detecting coil.

Referring to FIGS. 2 and 3A through 3G, the differential spiral magnetic field sensing device according to the present invention is constructed such that three coils, that is, a zero magnetic field detecting coil 13a–13b (terminals A and A'), a magnetic flux variation detecting coil 14a–14b (terminals B and B') and an excitation coil 15 (terminals C and C'), are wound adjacent to two-part soft magnetic film cores 12a/12b and 16a/16b sandwiched on a semiconductor substrate 11. Here, since the excitation coil 15 is spirally wound, as shown in FIG. 2, the magnetic fluxes of the upper and lower soft magnetic film cores 12a/12b and 16a/16b, generated by alternating excitation currents, are opposite to each other. Also, since the magnetic flux variation detecting coil 14a–14b (terminals B and B') is spirally wound throughout the area between the upper and lower soft magnetic film cores 12a/12b and 16a/16b, the induced voltage of the magnetic flux variation detecting coil 14a–14b (terminals B and B') generated by the electromagnetic induction due to alternating excitation current are offset because the directions of the magnetic fields of the two-part soft magnetic film cores 12a/12b and 16a/16b are opposite to each other. That is to say, since external magnetic field Hext is applied parallel to the axial directions of the two-part soft magnetic film cores 12a/12b and 16a/16b, the external magnetic field Hext is applied in the same direction with respect to the two-part soft magnetic film cores 12a/12b and 16a/16b. Since the excitation coil 15 is spirally wound with respect to the two-part soft magnetic film cores 12a/12b and 16a/16b so that excitation currents flow in an opposite direction 16a/16b excitation magnetic fields Hexc and –Hexc due to the excitation currents are generated to have opposite polarities, as shown in FIGS. 3A and 3B. Therefore, the internal magnetic fields of the two-part soft magnetic film cores 12a/12b and 16a/16b are Hext+Hexc and Hext–Hexc, as shown in FIGS. 3A and 3B. Here, since magnetic permeabilities of the two-part soft magnetic film cores 12a/12b and 16a/16b are equal to each other, the magnetic flux densities thereof are the same as that shown in FIGS. 3C and 3D. A voltage shown in FIG. 3F is induced to the magnetic flux variation detecting coil 14a–14b (terminals B and B'). Here, FIG. 3E shows induced voltages of the magnetic flux variation detecting coil 14a–14b (terminals B and B'), due to the respective magnetic flux densities of the two-part soft magnetic film cores 12a/12b and 16a/16b, which are combined to obtain a composite voltage shown in FIG. 3F. The magnitude of the external magnetic field Hext can be determined by measuring the magnitude of the composite voltage.

Also, the zero magnetic field detecting coil 13a–13b (terminals A and A') prevents the core magnetic flux from varying due to the external magnetic field, by generating a magnetic field for offsetting a variation in magnetic fluxes of a core generated in proportion to the magnitude of the external magnetic field, that is, a magnetic field having the waveforms indicated by thick broken lines in FIGS. 3A, 3B, 3C and 3D. FIG. 3G shows the DC value of the composite voltage (FIG. 3F) induced to the magnetic flux variation detecting coil 14a–14b (terminals B and B').

In the magnetic field sensing device using the semiconductor substrate 11, it is important to alternately wind turn by turn the excitation coil 15 spirally wound adjacent to the two-part soft magnetic film cores 12a/12b and 16a/16b the magnetic flux variation detecting coil 14a–14b and the zero magnetic field detecting coil 13a–13b in the two-part soft magnetic film cores 12a/12b and 16a/16b. As described above, the excitation coil 15, the magnetic flux variation detecting coil 14a–14b and the zero magnetic field detecting coil 13a–13b are wound to be laminated on the semiconductor substrate 11, where the excitation coil 15 is spirally wound for the currents flowing therethrough to be in opposite directions with respect to the two-part soft magnetic film cores 12a/12b and 16a/16b, and the magnetic flux variation detecting coil 14a–14b and the magnetic field detecting coil 13a–13b are wound spirally for the currents flowing therethrough to be in the same direction with respect to the two-part soft magnetic film cores 12a/12b and 16a/16b. In such a manner, when there is no external magnetic field Hext applied, the waveforms of induced voltages are offset. In other words, the magnetic flux generated by the excitation coil 15 has a winding structure in which closed magnetic paths are formed by the lower soft magnetic film core 12a–12b and the upper soft magnetic film core 16a–16b.

Unlike the above-described structure, if an excitation coil and a magnetic flux variation detecting coil are arranged in a single core, a magnetic field can be detected. However, in this case, burdensome signal processing such as amplification or filtering is required to eliminate outputs of the magnetic flux variation detecting coil because a large induced voltage is generated in the magnetic flux variation detecting coil due to the excitation coil even if there is no external magnetic field applied.

Figure 4:
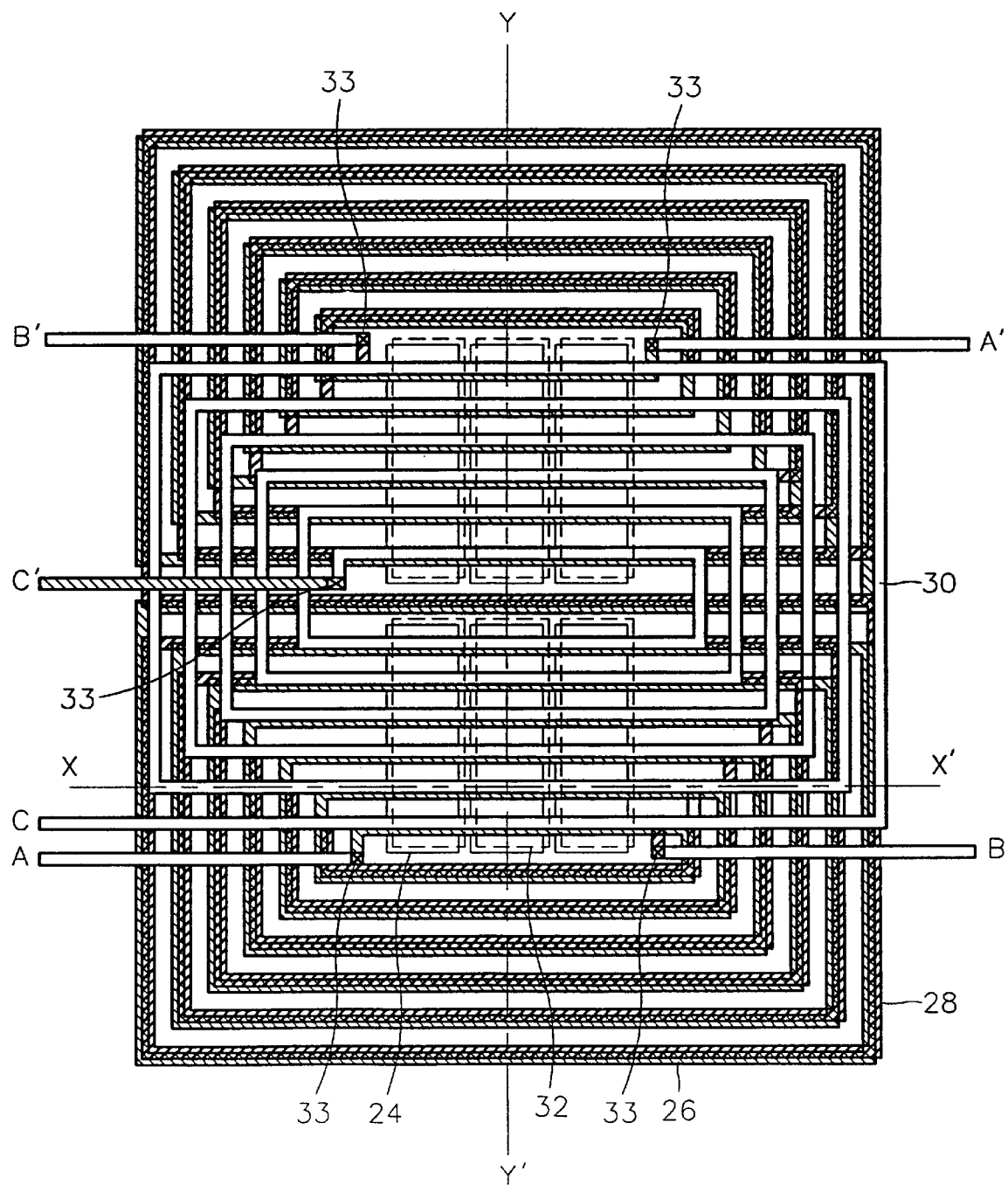
FIG. 4 is a plan view illustrating the magnetic field sensing device shown in FIG. 2.
Figure 5:
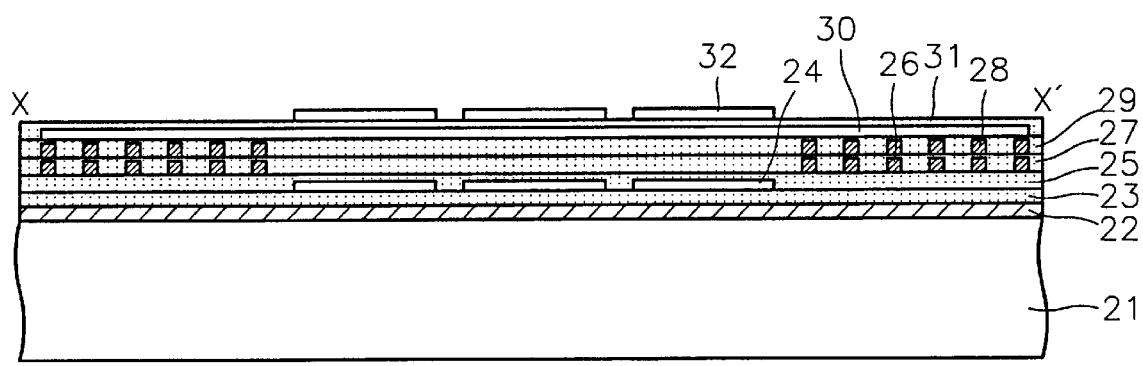
FIG. 5 is a cross-sectional view taken along the line X–X' of FIG. 4.
Figure 6:
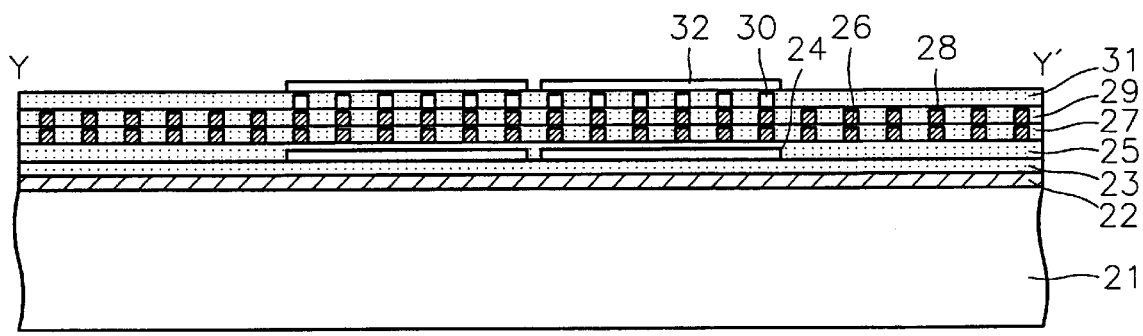
FIG. 6 is a cross-sectional view taken along the line Y–Y' of FIG. 4.

FIG. 4 is a plan view illustrating the differential spiral magnetic field sensing device shown in FIG. 2, FIG. 5 is a cross-sectional view taken along the line X–X' of FIG. 4, and FIG. 6 is a cross-sectional view taken along the line Y–Y' of FIG. 4. As shown in FIGS. 4 through 6, insulation layers 22 and 23 such as silicon oxide or polyimide are formed on a semiconductor substrate 21, and then lower and upper soft magnetic film cores 24 and 32 having three-layered metal wires are formed thereon. That is to say, the lower soft magnetic film core 24 and the upper soft magnetic film core 32 are formed on the insulation layer 23, the three-layered metal wires, that is, a bottom-layer wire 26, a middle-layer wire 28 and a top-layer wire 30 of a coil, are formed inside the lower and upper soft magnetic film cores 24 and 32 and then are connected to one another with throughholes 33 and 34 interposed therebetween, thereby realizing a spirally wound excitation coil having the same winding structure as that shown in FIG. 2 (15 of FIG. 2), and a magnetic flux variation detecting coil and a zero magnetic field detecting coil (14a–14b and 13a–13b of FIG. 2, respectively), each having two spirally wound parts. That is, according to an embodiment of the present invention, insulation layers (e.g., polyimide) 25, 27, 29 and 31 are inserted into the layers of the bottom-layer wire 24, the middle-layer wire 28 and the top-layer wire 32, and the lower and upper soft magnetic film cores 26 and 30 are interposed between the insulation layers 25, 27, 29 and 31.

In the case of using a semiconductor substrate as in this embodiment, it is important to design an excitation coil 15, a magnetic flux variation detecting coil 14a and 14b and zero magnetic field detecting coil 13a and 13b to wind turn by turn adjacent to soft magnetic film cores 24 and 32. If not, since the soft magnetic film cores have a large leakage magnetic flux, the magnetic flux variation due to the excitation coil 15 cannot be sufficiently picked up by the magnetic flux variation detecting coil 14a and 14b. Also, a spirally wound excitation coil 15, and a magnetic flux variation detecting coil 14a and 14b and a zero magnetic field detecting coil 13a and 13b, each having two spirally wound parts, are alternately wound turn by turn on the semiconductor substrate and are differentially driven at the same time using two cores, thereby forming closed magnetic paths. Accordingly, when there is no external magnetic field, induced voltages generated from the internal magnetic flux variation due to the excitation coil are offset, thereby preventing magnetic fluxes in the cores from varying. Further, soft magnetic film cores 12a, 12b and 16a, 16b are split into several parts, thereby reducing anti-magnetic field components.

FIGS. 7A through 7F illustrate processing steps of a method for manufacturing the differential spiral magnetic field sensing device according to an embodiment of the present invention shown in FIGS. 4, 5 and 6. Here, a silicon substrate, for example, is used as the semiconductor substrate.

Figure 7A:
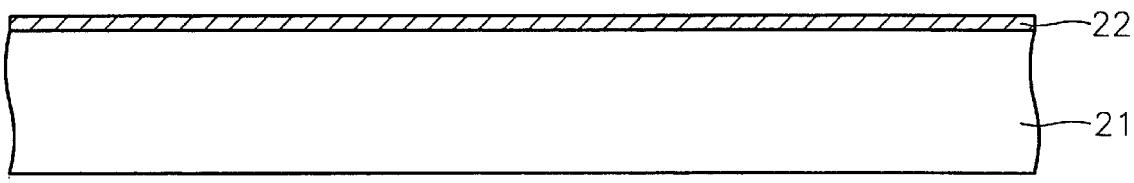
FIGS. 7A through 7F illustrate processing steps of a method for manufacturing the magnetic field sensing device shown in FIG. 2.

First, as shown in FIG. 7A, the surface of a silicon substrate 21 is thermally oxidized for insulation of the same to form an insulation layer (SiO$_2$) 22.

Figure 7B:
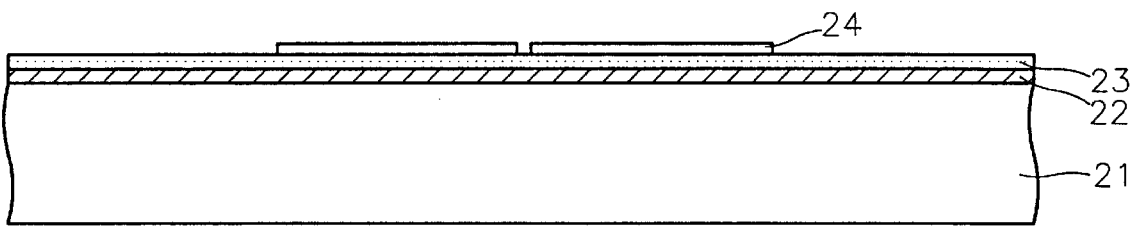

As shown in FIG. 7B, another insulation layer 23, e.g., silicon oxide, photoresist or polyimide, is formed on the SiO$_2$ insulation layer 22. A soft magnetic film material is deposited on the insulation layer 23 and then patterned, thereby forming a lower soft magnetic film core 24. To deposit the soft magnetic film material on the insulation layer 23, various methods including an electroplating method and a deposition method such as a sputtering method or a chemical vapor deposition (CVD) method may be employed. Soft magnetic materials include a permalloy (an alloy of nickel (Ni) and iron (Fe)) and various amorphous magnetic alloys.

Figure 7C:
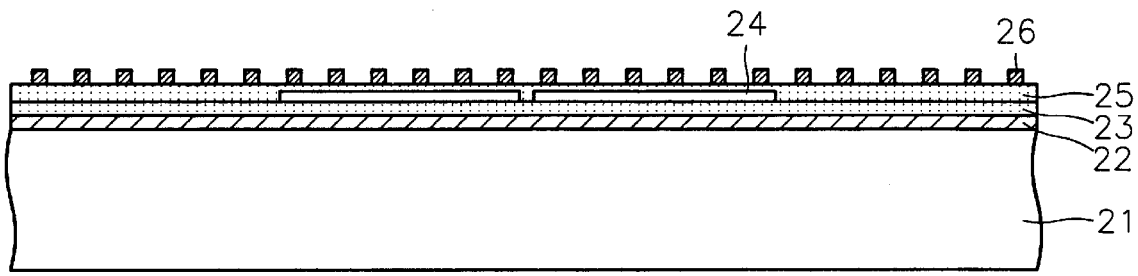

Next, as shown in FIG. 7C, silicon oxide, photoresist or polyimide is further deposited to cover the lower soft magnetic film core 24 on the insulation layer 23 having the lower soft magnetic film core 24, thereby forming an insulation layer 25. As the deposition method of the insulation layer 25, a sputtering method or a chemical vapor deposition (CVD) method may be employed using silicon oxide, photoresist or polyimide. The photoresist and the polyimide is cured to be used as an insulation layer. Here, a planarization process is performed on the lower soft magnetic film core to avoid surface roughness, and then a metal layer for a zero magnetic field detecting coil 13a and 13b is deposited thereon to then be patterned by etching the same using photolithography, thereby forming a bottom-layer wire 26 for the zero magnetic field detecting coil. As the metal, Au for the bottom-layer wire 26, Cu or Al is used. To deposit the metal layer, various methods including a deposition method such as a sputtering method or a chemical vapor deposition (CVD) method may be employed. However, in the case of forming a thick Cu layer, it is effective to employ an electroplating method or a non-electrolytic plating method.

Figure 7D:
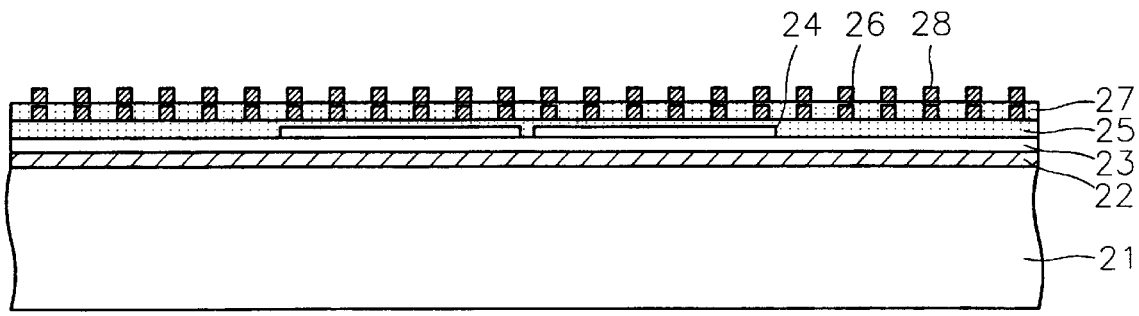

As shown in FIG. 7D, an insulation layer (polyimide, etc.) 27 is deposited to cover the bottom-layer wire 26 and planarized, and then a metal material for a magnetic flux variation detecting coil 14a,14b is deposited thereon and patterned, thereby forming a middle-layer wire 28 for the magnetic flux variation detecting coil.

Figure 7E:
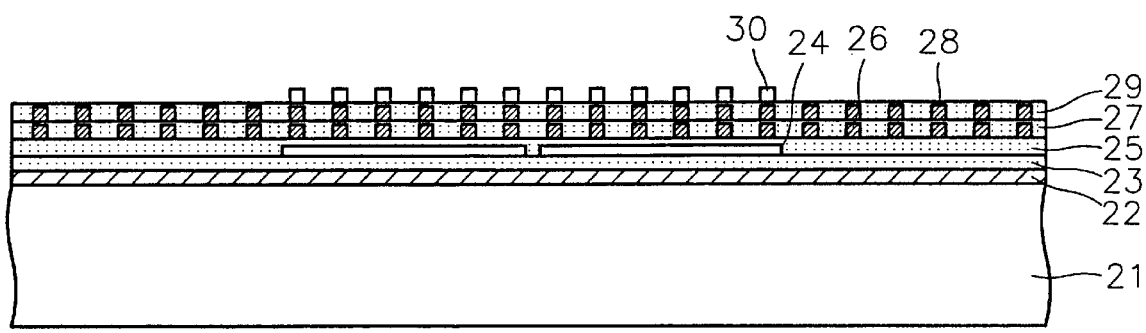

Then, as shown in FIG. 7E, an insulation layer (polyimide, etc.) 29 is deposited on the insulation layer 27 to cover the middle-layer wire 28 and planarized to then be etched using photolithography, thereby forming throughholes (33 of FIG. 4). Then, a metal material for an excitation coil 15 is deposited and patterned to form an upper-layer wire 30 of the excitation coil.

Figure 7F:
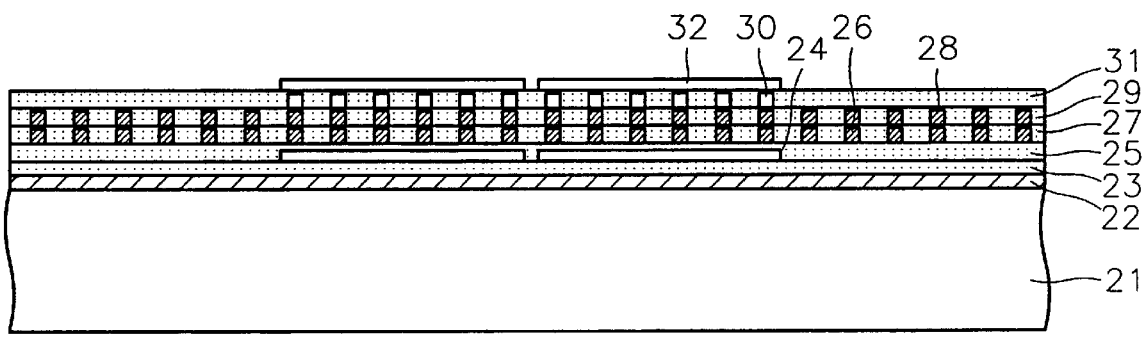

Next, as shown in FIG. 7F, an insulation layer (polyimide, etc.) 31 is deposited to cover the upper-layer wire 30 and planarized, and then a soft magnetic film material is deposited thereon and patterned to form the upper soft magnetic film core 32.

Now, an embodiment of a magnetic field detection module having the differential spiral magnetic field sensing device manufactured in the above-described manner integrated therein will be described in detail with reference to FIGS. 8 through 10.

Figure 8:
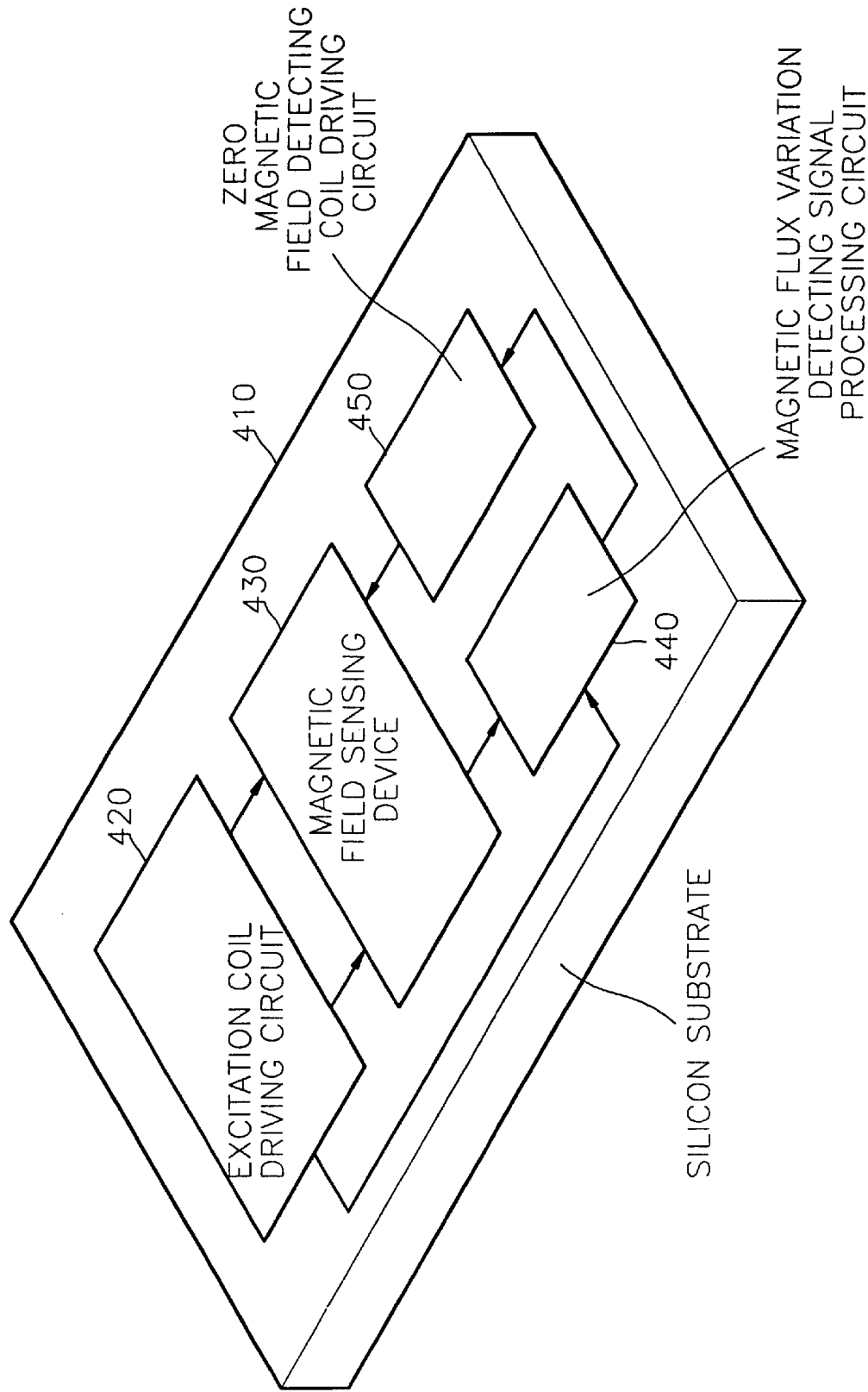
FIG. 8 is a schematic perspective view of a magnetic field detection module adopting the magnetic field sensing device shown in FIG. 2.

FIG. 8 is a schematic perspective view of a magnetic field detection module according to an embodiment of the present invention. As shown in FIG. 8, the magnetic field detection module according to the present invention is constructed such that an excitation coil driving circuit 420, a magnetic field sensing device 430, a magnetic flux variation detecting signal processing circuit 440 and a zero magnetic field detecting coil driving circuit 450 are integrated on a semiconductor substrate 410. The magnetic field sensing device 430 is a differential spiral magnetic field sensing device, as described above. Electromagnetic circuits necessary for driving the differential spiral magnetic field sensing device, that is, 420, 440 and 450, are integrated on the semiconductor substrate 410.

Figure 9:
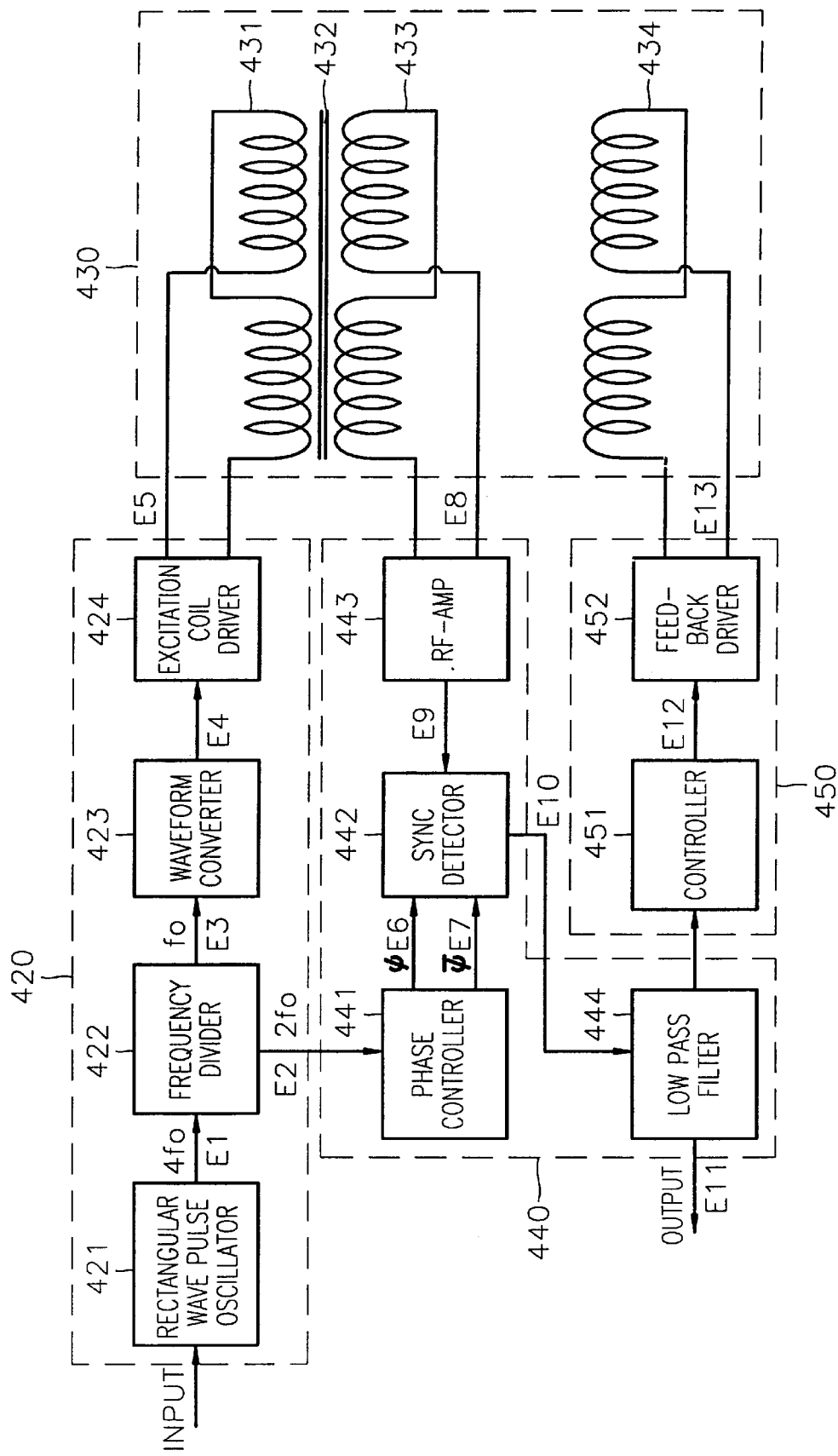
FIG. 9 is a block diagram of an integrated circuit having the magnetic field detection module shown in FIG. 8.

FIG. 9 is a block diagram of an integrated circuit having the magnetic field detection module shown in FIG. 8, and FIGS. 10A through 10H are timing diagrams illustrating the operation of the integrated circuit having the magnetic field sensing device shown in FIG. 9. As shown in FIG. 9, the magnetic field detection module according to the present invention consists largely of an excitation coil driving circuit 420, a differential spiral magnetic field sensing device 430, a magnetic flux variation detecting signal processing circuit 440 and a zero magnetic field detecting coil driving circuit 450. Here, the excitation coil driving circuit 420 includes a rectangular wave oscillator 421, a frequency divider 422, a waveform converter 423 and an excitation coil driver 424. The differential spiral magnetic field sensing device 430 includes a soft magnetic film core 432 forming closed magnetic paths, an excitation coil 431, a magnetic flux variation detecting coil 433 and a zero magnetic field detecting coil 434. The magnetic flux variation detecting signal processing circuit 440 includes an RF amplifier 443, a sync detector 442, a low pass filter 444 and a phase controller 441. The zero magnetic field detecting coil driving circuit 450 includes a controller 451 and a feed-back driver 452.

The magnetic field detection module having the aforementioned configuration operates as follows.

First, a voltage pulse E1 of a frequency 4of is generated in the rectangular wave pulse oscillator 421 and is divided by the frequency divider 422 at a first stage to then be converted into a pulse E2 of a frequency 2fo, which is one half the pulse E4 and whose duty ratio is 50%. The frequency 2fo is higher than or equal to 1 MHz so as to obtain a sufficiently high sensitivity. Then, the pulse E2 is divided by the frequency divider 422 at a second stage to then be a pulse E3 of a frequency of, one half that of the pulse E2. The pulse E3 of the frequency of output from the frequency divider 422 is applied to the waveform converter 423 to then be converted into a triangular wave E4 to be applied to the excitation coil driver 424. The excitation coil driver 424 converts the applied triangular wave E4 into a current E5 of a triangular wave shown in FIG. 10D to drive the excitation coil 431 of the magnetic field sensing device 430. Here, if there is no external magnetic field applied, a voltage is not induced to the magnetic flux variation detecting coil 433 of the magnetic field sensing device 430. If an external magnetic field is applied, there is produced a magnetic field detecting signal E8 having a waveform similar to that shown in FIG. 10E. The magnetic field detecting signal E8 is amplified by the RF-AMP 443 to produce a magnetic field detecting signal E9 having the waveform shown in FIG. 10E. The amplified magnetic field detecting signal E9 is applied to the sync detector 442. The sync detector 442 detects a pulse sync of the amplified magnetic field detecting signal E9 using two pulses ΨE6 and $\overline{\Psi E7}$ shown in FIGS. 10A and 10B generated in the phase controller 441 based on the output of the first-stage frequency divider 442, that is, 2fo, to then be converted into a signal E10 shown in FIG. 10F. If the signal E10 passes through the low pass filter 444, it is smoothed as shown in FIG. 10G to obtain a DC voltage E11. Since the magnitude of the DC voltage E11 is proportional to an external DC magnetic field, the external DC magnetic field can be measured. The controller 451 determines the magnitude of the external DC voltage E11 which is proportional to the external magnetic field and generates a control signal E12 for controlling the feed-back driver 452. The feed-back driver 452 generates a feed-back current E13 shown in FIG. 10H for offsetting the magnetic flux variation of a soft magnetic film core, the magnetic flux variation being proportional to the magnitude of the external magnetic field, in accordance with the control signal E12, thereby driving the zero magnetic field detecting coil 434.

As described above, according to the present invention, the differential spiral magnetic field sensing device is constructed by soft magnetic film cores formed on a semiconductor substrate, an excitation coil formed of a metal film pattern for alternating excitation of the soft magnetic film cores, a magnetic flux variation detecting coil formed of a metal film, and a zero magnetic field detecting coil formed of a metal film for offsetting measured magnetic fields by generating anti-magnetic field components of the measured magnetic fields, wherein two soft magnetic film cores are arranged in parallel to each other, each soft magnetic film core is divided into several parts in a detection axial direction to reduce anti-magnetic field components, the differential excitation coil (two excitation coils wound spirally), the magnetic flux variation detecting coil and the zero magnetic field detecting coil are laminated and wound turn by turn around the soft magnetic film cores, and there is no induced voltage waveform to the magnetic flux variation detecting coil without external magnetic field. Therefore, although the differential magnetic field sensing device is fabricated on a microscopic scale, it can detect a very weak magnetic field. Also, in order to minimize the leaked magnetic field components of the soft magnetic film cores, the soft magnetic film cores are sandwiched to form closed magnetic paths, and the differential excitation coil, the magnetic flux variation detecting coil and the zero magnetic field detecting coil are spirally laminated around the sandwiched soft magnetic film cores. Thus, magnetic flux variation does not occur in the soft magnetic film cores due to the measured external magnetic field.

Also, in the magnetic field detection module according to the present invention, a differential spiral magnetic field sensing device and a signal process for driving the same are integrated on the substrate of a monolithic semiconductor device. In detail, the present invention provides a magnetic field detection module including a differential spiral magnetic field sensing device constituted by soft magnetic film cores formed on a semiconductor substrate, an excitation coil formed of a metal film pattern for alternating excitation of the soft magnetic film cores, a magnetic flux variation detecting coil formed of a metal film, and a zero magnetic field detecting coil formed of a metal film for offsetting measured magnetic fields by generating anti-magnetic field components of the measured magnetic fields, an excitation coil driving circuit connected to the excitation coil and integrated on the semiconductor substrate, a magnetic field detecting signal processing circuit connected to the magnetic field variation detecting coil and integrated on the semiconductor substrate, and a zero magnetic detecting coil driving circuit connected to the zero magnetic field detecting coil and a signal processing circuit and integrated on the semiconductor substrate, thereby implementing an integrated magnetic field detection module manufactured on a microscopic scale. In spite of its microscopic scale, the module has high sensitivity and mass production is possible at low cost.

The above-described magnetic field sensing device and the magnetic field detection module having the same integrated therein can be widely applied to navigation systems for detecting terrestrial magnetism, terrestrial magnetism variation monitors (for prediction of earthquakes), biomagnetism detecting sensors, metal defect sensors and the like. Also, the magnetic field sensing device can be indirectly applied to magnetic encoders, non-contact potentiometers, current sensors, torque sensors, displacement sensors and the like.

What is claimed is:

1. A differential spiral magnetic field sensing device comprising:
    a semiconductor substrate;
    soft magnetic film cores stacked on the semiconductor substrate to be laminated to form closed magnetic paths;
    an excitation coil formed of a metal thin film for alternate excitation of the soft magnetic film cores;
    a magnetic flux variation detecting coil made of a metal thin film for detection of magnetic flux variation in the soft magnetic film cores; and
    a zero magnetic field detecting coil for generating anti-magnetic field components for eliminating magnetic flux variation in the soft magnetic film cores generated by an external magnetic field.

2. The differential spiral magnetic field sensing device according to claim 1, wherein the soft magnetic film cores are divided into two parts to then be arranged parallel to each other, the two-part soft magnetic film cores are sub-divided into a predetermined number of parts, the excitation coil is wound n turns, where n is a positive integer, the magnetic flux variation detecting coil is wound m turns, where m is a positive integer, and the zero magnetic field detecting coil is wound one turn, the excitation coil, the magnetic flux variation detecting coil and the zero magnetic field detecting coil being laminated, and wherein when an external magnetic field is zero, the induced waveforms caused by the excitation coil are offset.

3. The differential spiral magnetic field sensing device according to claim 1, wherein two soft magnetic film cores are arranged one on top of the other, and the excitation coil, the magnetic flux variation detecting coil and the zero magnetic field detecting coil are laminated on three planes in the form of spiral bottom-layer, middle-layer and top-layer wires in the soft magnetic film cores.

4. A magnetic field detection module comprising:
    a differential spiral magnetic field sensing device having a semiconductor substrate, soft magnetic film cores stacked on the semiconductor substrate to be laminated to form closed magnetic paths, an excitation coil formed of a metal thin film for alternate excitation of the soft magnetic film cores, a magnetic flux variation detecting coil made of a metal thin film for detection of magnetic flux variation in the soft magnetic film cores, and a zero magnetic field detecting coil for generating anti-magnetic field components for eliminating magnetic flux variation in the soft magnetic film cores generated by an external magnetic field;
    an excitation coil driving circuit connected to the excitation coil and integrated on the semiconductor substrate;
    a magnetic field detecting signal processing circuit connected to the magnetic field variation detecting coil and integrated on the semiconductor substrate; and
    a zero magnetic detecting signal processing circuit connected to the zero magnetic field detecting coil and integrated on the semiconductor substrate.

5. The magnetic field detection module according to claim 4, wherein the soft magnetic film cores are divided into two parts to then be arranged parallel to each other, the two-part soft magnetic film cores are-sub-divided into a predetermined number of parts, the excitation coil is wound n turns, where n is a positive integer, the magnetic flux variation detecting coil is wound m turns, where m is a positive-integer, and the zero magnetic field detecting coil is wound one turn, the excitation coil, the magnetic flux variation detecting coil and the zero magnetic field detecting coil being laminated, and wherein when an external magnetic field is zero, the induced waveforms caused by the excitation coil are offset.

6. The magnetic field detection module according to claim 4, wherein two soft magnetic film cores are arranged one on top of the other, and the excitation coil, the magnetic flux variation detecting coil and the zero magnetic field detecting coil are laminated on three planes in the form of spiral bottom-layer, middle-layer and top-layer wires in the soft magnetic film cores.

7. The magnetic field detection module according to claim 4, wherein the excitation coil driving circuit comprises:
    a rectangular wave oscillator for generating rectangular wave voltage pulses;
    a frequency divider for dividing the rectangular wave voltage pulses to a half and a fourth, respectively;
    a waveform converter for converting the one fourth rectangular wave voltage pulse into a triangular voltage pulse; and
    an excitation coil driver for driving the excitation coil using the triangular voltage pulse.

8. The magnetic field detection module according to claim 4, wherein the magnetic flux variation detecting signal processing circuit comprises:
    a phase controller for producing inverse rectangular voltage pulses of the same frequency of the one half rectangular voltage pulse using the same;
    an RF amplifier for amplifying an external magnetic field detecting signal output from the external magnetic field detecting coil;
    a sync detector for detecting the amplified external magnetic field detecting signal using the one half rectangular wave voltage pulse and the inverse pulse thereof; and
    a low pass filter for smoothing the amplified external magnetic field detecting signal detected by the sync detector into a DC voltage.

9. The magnetic field detection module according to claim 4, wherein when the zero magnetic field detecting coil driving circuit comprises:
    a controller for providing a control signal for controlling the zero magnetic field detecting coil to be driven based on the output voltage of the magnetic field signal processing circuit; and
    a feed-back driver for driving the zero magnetic field detecting coil in accordance with the control signal.

* * * * *